US012652777B2

(12) United States Patent
Langmuir et al.

(10) Patent No.: US 12,652,777 B2
(45) Date of Patent: Jun. 9, 2026

(54) OPTIMIZED MICRO DATA CENTER

(71) Applicant: SCHNEIDER ELECTRIC IT CORPORATION, Foxboro, MA (US)

(72) Inventors: Karl Duncan Langmuir, Providence, RI (US); Tannan Whidden Winter, Fitchburg, MA (US); Stuart Michael Sheehan, Narragansett, RI (US); Deborah Marie Dailey, Centreville, VA (US); Kevin Robert Brown, Portsmouth, RI (US); Diau Park Zynsky Hall, Exeter, RI (US); Benoit Devinat, Gordes (FR)

(73) Assignee: SCHNEIDER ELECTRIC IT CORPORATION, Foxboro (MA)

( * ) Notice: Subject to any disclaimer, the term of this patent is extended or adjusted under 35 U.S.C. 154(b) by 252 days.

(21) Appl. No.: 18/211,363

(22) Filed: Jun. 19, 2023

(65) Prior Publication Data

US 2024/0023268 A1 Jan. 18, 2024

Related U.S. Application Data

(60) Provisional application No. 63/389,465, filed on Jul. 15, 2022.

(51) Int. Cl.
*H05K 7/14* (2006.01)
*H05K 7/20* (2006.01)
(52) U.S. Cl.
CPC ....... *H05K 7/1492* (2013.01); *H05K 7/20736* (2013.01)

(58) Field of Classification Search
CPC ............. H05K 7/1492; H05K 7/20736; H05K 7/1485; H05K 7/20718; H05K 7/20136
See application file for complete search history.

(56) References Cited

U.S. PATENT DOCUMENTS

| | | | | |
|---|---|---|---|---|
| 5,584,396 A | * | 12/1996 | Schmitt | H02B 1/36 |
| | | | | 211/26 |
| 5,684,671 A | * | 11/1997 | Hobbs | G06F 1/184 |
| 6,317,320 B1 | * | 11/2001 | Cosley | H05K 7/20581 |
| | | | | 174/15.1 |
| 6,538,879 B2 | * | 3/2003 | Jiang | G06F 1/184 |
| | | | | 312/223.1 |

(Continued)

FOREIGN PATENT DOCUMENTS

EP 3451489 A1 3/2019

OTHER PUBLICATIONS

Extended European Search Report in EP23185047.0, mailed Dec. 11, 2023, 7 pages.

*Primary Examiner* — Jayprakash N Gandhi
*Assistant Examiner* — Matthew Sinclair Muir
(74) *Attorney, Agent, or Firm* — FIG. 1 Patents

(57) ABSTRACT

A modular data center comprises a base electrical module including an uninterruptible power supply ("UPS") bypass switch, a power connection terminal coupled to the bypass switch, and a UPS power connector, a UPS rack coupled to the base electrical module and configured to house a UPS that receives power from the UPS power connector, and an information technology ("IT") equipment rack coupled to the base electrical module and configured to house IT equipment that receives power from the base electrical module, the base electrical module being external to the IT equipment rack.

27 Claims, 18 Drawing Sheets

(56)  References Cited

U.S. PATENT DOCUMENTS

| | | | |
|---|---|---|---|
| 6,967,283 B2* | 11/2005 | Rasmussen | G06F 1/189 |
| | | | 361/600 |
| 7,466,559 B2* | 12/2008 | Korber | H05K 7/1424 |
| | | | 361/756 |
| 7,542,268 B2* | 6/2009 | Johnson, Jr. | H05K 7/1492 |
| | | | 174/59 |
| 8,562,358 B2* | 10/2013 | Panella | H05K 1/118 |
| | | | 439/607.05 |
| 8,913,393 B2* | 12/2014 | Mimlitch, III | H05K 7/1488 |
| | | | 312/223.1 |
| 9,345,173 B2 | 5/2016 | Czamara et al. | |
| 9,572,290 B2 | 2/2017 | Chen | |
| 9,635,778 B2* | 4/2017 | Tsai | H05K 7/1488 |
| 9,772,610 B2 | 9/2017 | Slessman | |
| 9,943,005 B2 | 4/2018 | Chen | |
| 10,164,827 B2* | 12/2018 | Furukawa | H04L 41/122 |
| 10,660,231 B2* | 5/2020 | Franz | H01R 25/006 |
| 10,779,440 B2 | 9/2020 | Czamara et al. | |
| 11,602,069 B2 | 3/2023 | Sheehan et al. | |
| 2002/0084089 A1* | 7/2002 | Holt | H02B 1/308 |
| | | | 174/50 |
| 2014/0254085 A1 | 9/2014 | Slessman | |
| 2016/0363966 A1* | 12/2016 | Davis | G11B 33/128 |
| 2016/0366781 A1* | 12/2016 | Paatero | H05K 5/0217 |
| 2021/0112677 A1* | 4/2021 | Bailey | H05K 7/1497 |
| 2021/0251101 A1 | 8/2021 | Sheehan et al. | |

* cited by examiner

OPTIMIZED MICRO DATA CENTER

CROSS-REFERENCE TO RELATED APPLICATION

This application claims the benefit under 35 U.S.C. § 119(e) of U.S. Provisional Patent Application No. 63/389, 465 titled OPTIMIZED MICRO DATA CENTER filed on Jul. 15, 2022, which is herein incorporated by reference in its entirety for all purposes.

BACKGROUND OF DISCLOSURE

1. Field of Disclosure

Aspects of the present disclosure relate generally to data centers, including microdata centers, that contain racks and enclosures used to house data processing, power, networking and telecommunications equipment.

2. Discussion of Related Art

Equipment enclosures or racks for housing electronic equipment, such as data processing, power, networking and telecommunications equipment have been used for many years. Such racks are used to contain and to arrange the equipment in small wiring closets, microdata centers, small rooms, as well as equipment rooms and large data centers. An equipment rack can be an open configuration and can be housed within a rack enclosure, although the enclosure may be included when referring to a rack.

Hangable information technology ("IT") racks are known in the industry. Presently, hangable IT racks are assembled onsite, i.e., at the user's final location, and if an electrician is needed to hard-wire the microdata center, the electrician may be forced to address pre-installed IT equipment that is in the way.

SUMMARY OF DISCLOSURE

One aspect of the present disclosure is directed to a modular data center. The modular data center comprises a base electrical module including an uninterruptible power supply ("UPS") bypass switch and a UPS power connector, a first frame coupled to the base electrical module and configured to house a UPS that receives power from the UPS power connector, and a second frame coupled to the base electrical module and configured to house IT equipment that receives power from the base electrical module, the base electrical module being external to the second frame.

In some embodiments, the base electrical module further includes a power connection terminal coupled to the bypass switch.

In some embodiments, the modular data center further comprises a UPS rack included in the first frame, the UPS rack configured for mounting the UPS thereto.

In some embodiments, the modular data center further comprises a UPS rack coupled to the first frame.

In some embodiments, the modular data center further comprises an IT equipment rack included in the second frame, the IT equipment rack configured for mounting the IT equipment thereto.

In some embodiments, the modular data center further comprises an IT equipment rack coupled to the second frame.

In some embodiments, the base electrical module further includes a fan module configured to direct air through the IT equipment rack.

In some embodiments, the modular data center further comprises a fan module included in the base electrical module and configured to direct air through the second frame, and a casing coupled to the fan module with a hinge, the casing enclosing the base electrical module, first frame, and second frame when in a closed position.

In some embodiments, the base electrical module is configured to be mounted to a wall.

In some embodiments, the first frame is coupled to the base electrical module with a hinge.

In some embodiments, the second frame is indirectly coupled to the base electrical module.

In some embodiments, the modular data center further comprises a UPS rack included in the first frame and an IT equipment rack included in the second frame.

In some embodiments, the second frame is removably supported by the first frame.

In some embodiments, the second frame is removably clipped to the first frame.

In some embodiments, the modular data center further comprises a casing removably coupleable to the base electrical module, the casing enclosing the base electrical module, first frame, and second frame when coupled to the base electrical module.

In some embodiments, the modular data center further comprises a casing coupled to the base electrical module with a hinge, the casing enclosing the base electrical module, the first frame, and the second frame when in a closed position.

In some embodiments, the modular data center further comprises a power distribution unit having a plurality of outlets mounted on the second frame and configured to provide power from the base electrical module to the IT equipment.

In some embodiments, the base electrical module further includes a patch panel.

In some embodiments, the base electrical module further includes an Internet gateway device.

In some embodiments, the modular data center further comprises a power distribution unit having a plurality of outlets mounted on the first frame.

In some embodiments, the base electrical module further includes a visual indicator of status of the modular data center.

In some embodiments, the modular data center further comprises at least one backup UPS.

In some embodiments, the modular data center further comprises at least one server.

In accordance with another aspect, there is provided a method of assembling and installing a modular data center. The method comprises installing a base electrical module on a wall, the base electrical module including an uninterruptible power supply ("UPS") bypass switch and a UPS power connector, hingedly connecting a first frame to the base electrical module, the first frame configured to house a UPS that receives power from the UPS power connector, and connecting a second frame to the first frame, the second frame configured to house IT equipment that receives power from the base electrical module, the base electrical module being external to the IT equipment rack.

In some embodiments, the method further comprises securing a power distribution unit to the second frame.

In some embodiments, the method further comprises securing a backup UPS module to the first frame.

In some embodiments, the method further comprises securing a cover to the base electrical module.

BRIEF DESCRIPTION OF DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, identical or nearly identical components illustrated in various figures may be represented by like numerals. For purposes of clarity, not every component may be labeled in every figure. In the drawings.

DETAILED DESCRIPTION

Figure 1:
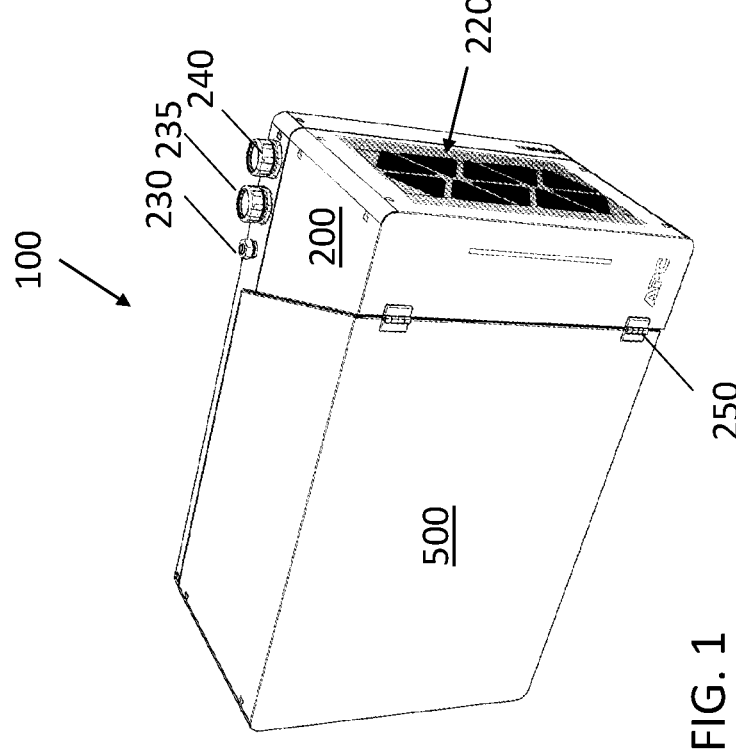
FIG. 1 is a perspective view of an exemplary modular data center of embodiments of the present disclosure in a closed configuration.
Figure 2:
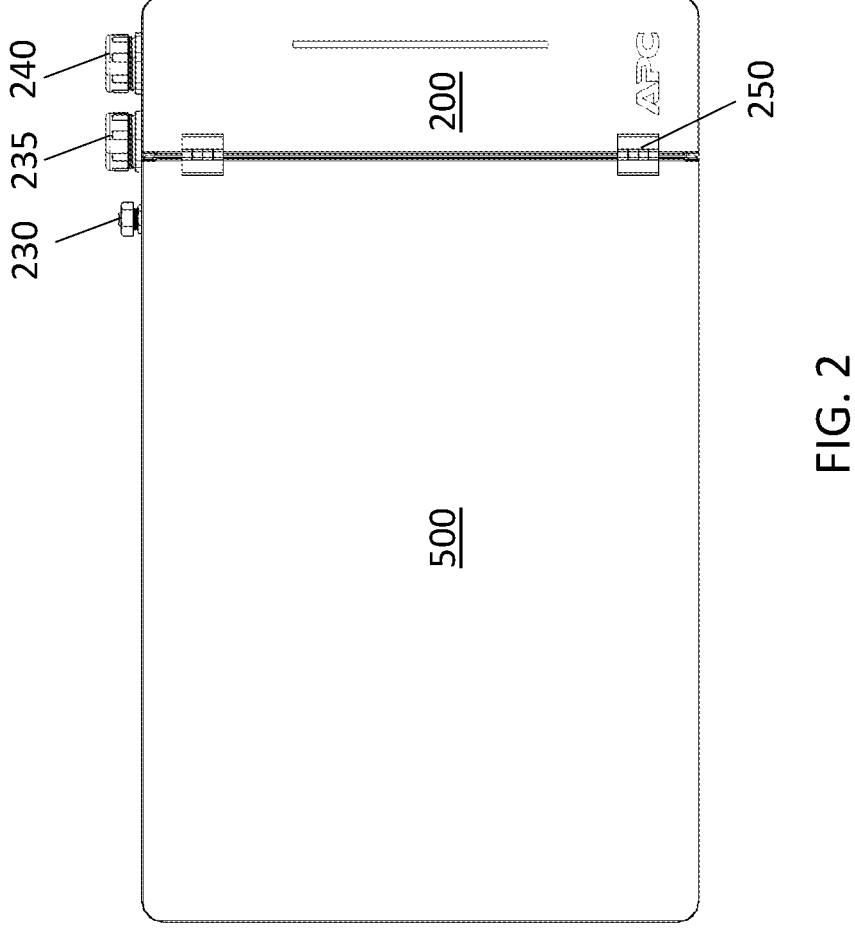
FIG. 2 is a front elevational view of an exemplary modular data center of embodiments of the present disclosure in a closed configuration.
Figure 3:
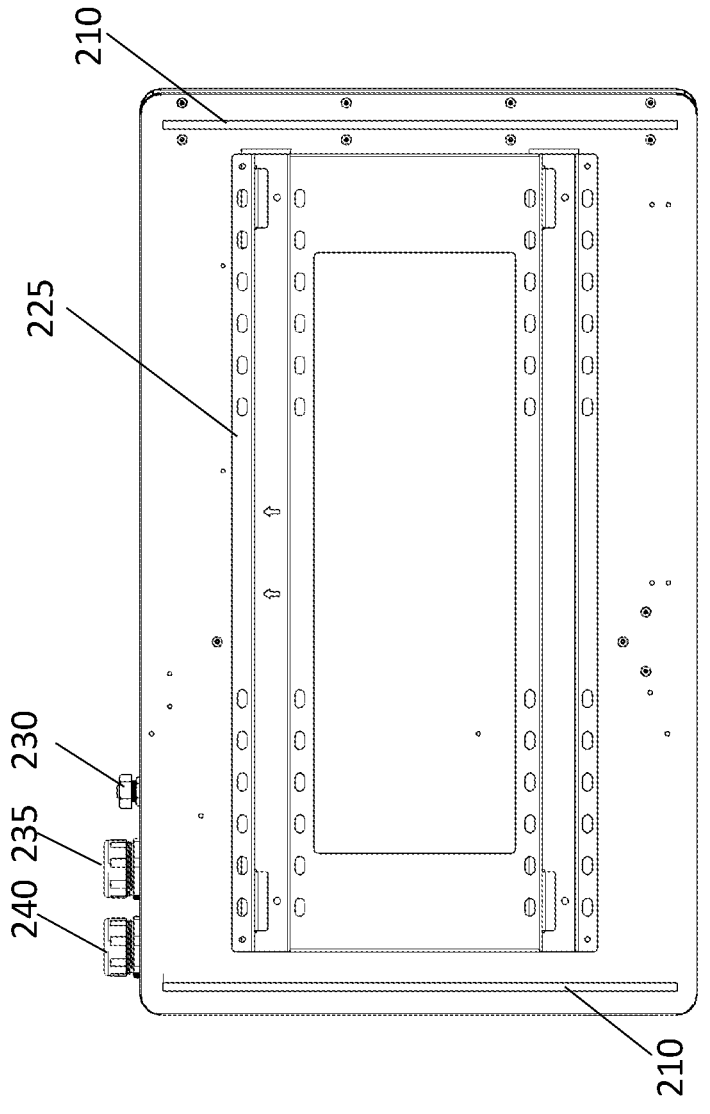
FIG. 3 is a rear elevational view of an exemplary modular data center of embodiments of the present disclosure in a closed configuration.
Figure 4:
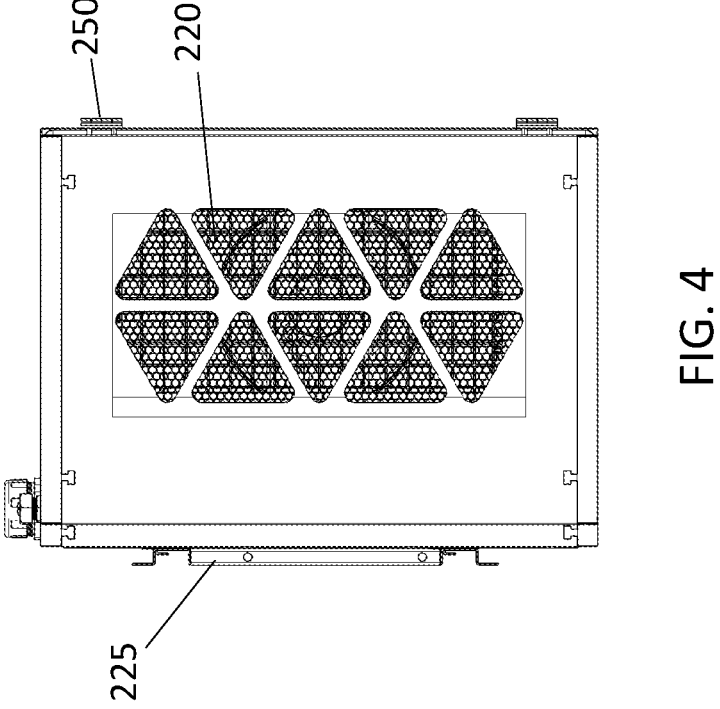
FIG. 4 is right elevational view of an exemplary modular data center of embodiments of the present disclosure in a closed configuration.
Figure 5:
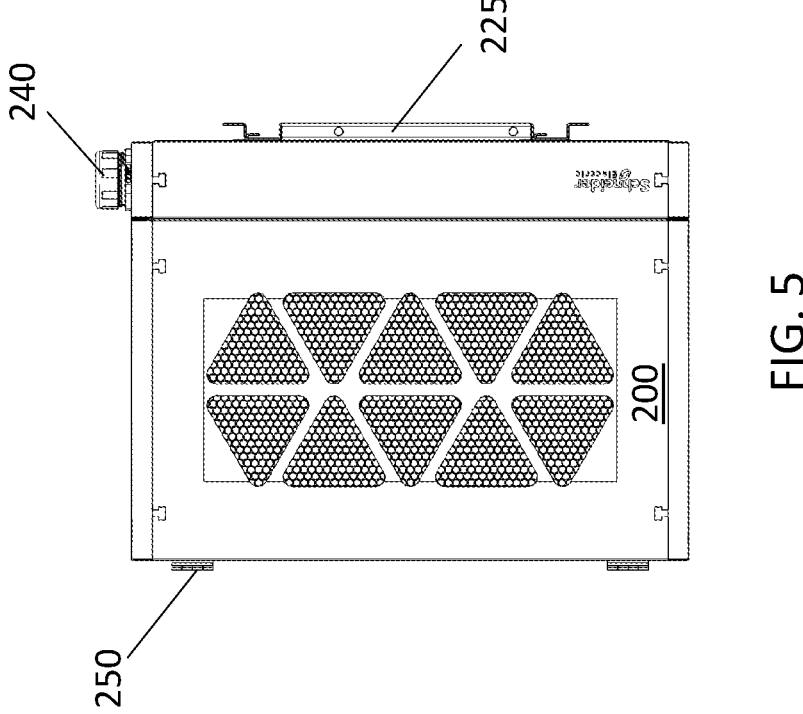
FIG. 5 is a left elevational view of an exemplary modular data center of embodiments of the present disclosure in a closed configuration.
Figure 6:
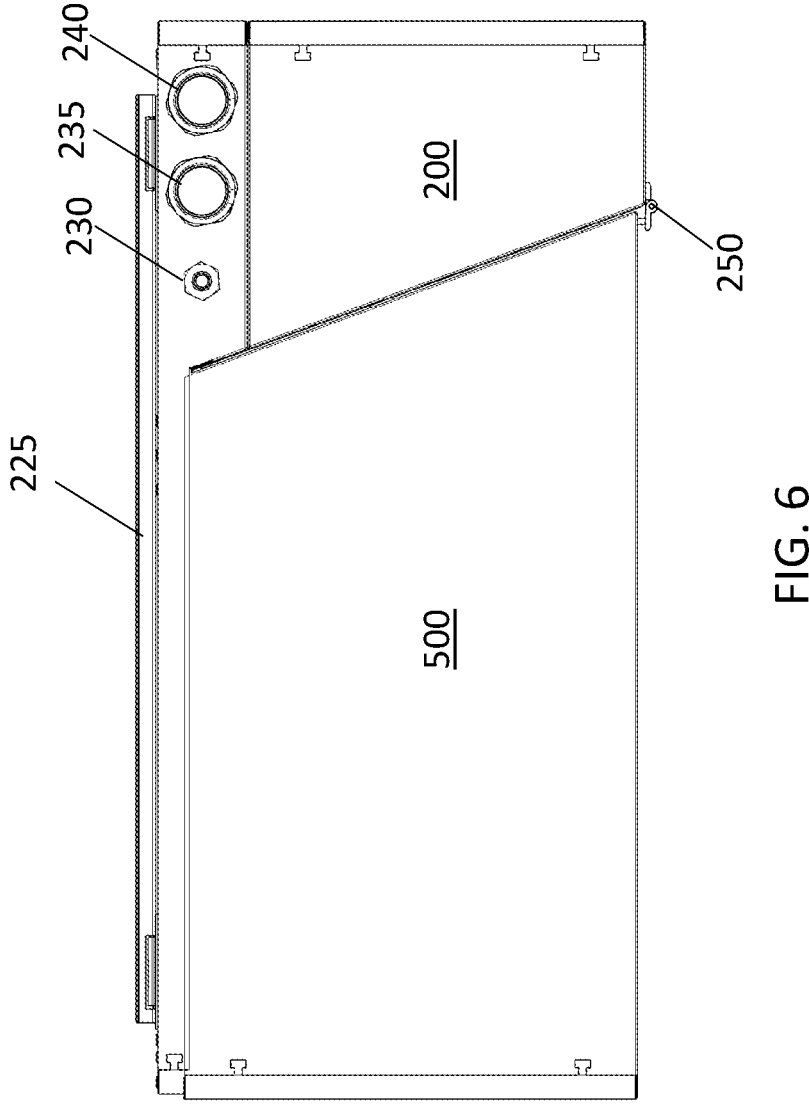
FIG. 6 is a view from the top of an exemplary modular data center of embodiments of the present disclosure in a closed configuration.
Figure 7:
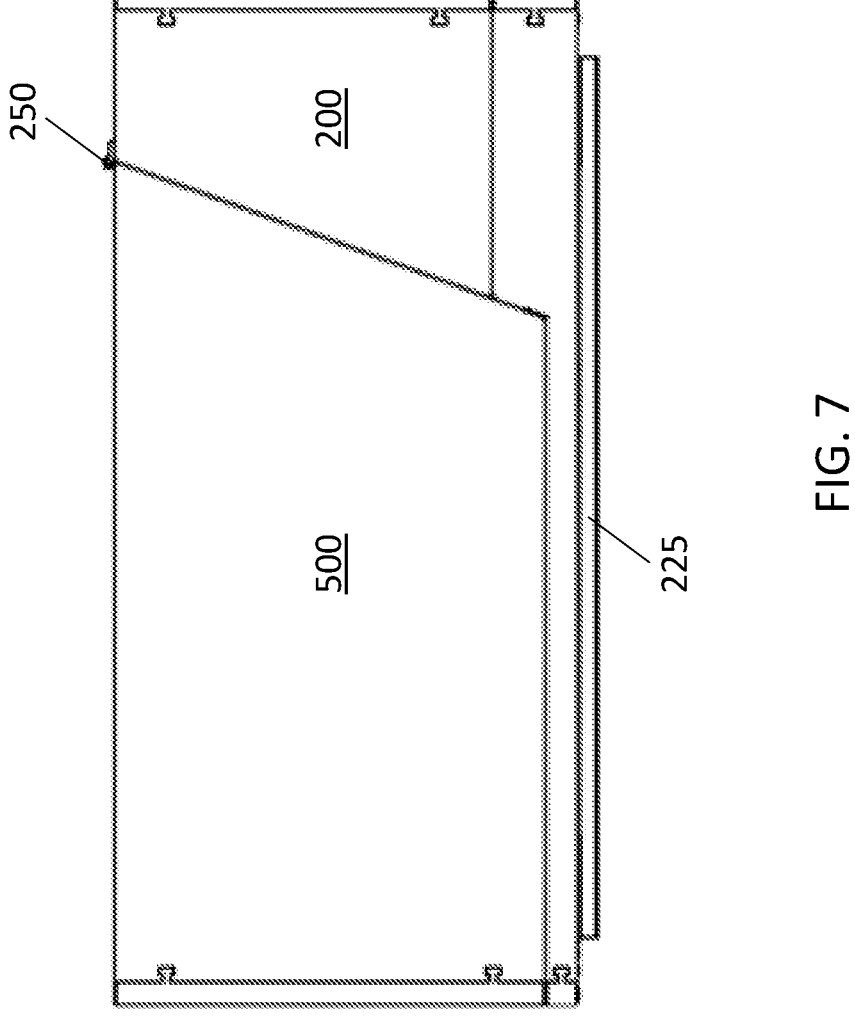
FIG. 7 is a view from the bottom of an exemplary modular data center of embodiments of the present disclosure in a closed configuration.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing", "involving", and variations thereof herein, is meant to encompass the items listed thereafter and equivalents thereof as well as additional items.

All-in-one equipment racks may be used in microdata centers for edge application, which are typically deployed in closets or other locations without adequate cooling resources. These applications use racks sealed from the surrounding ambient air for physical security and environment protection. The equipment racks require highly varied requirements, including but not limited to environment, serviceability, security, and management.

As used herein, "enclosures" and "racks" are used to describe apparatus designed to support electronic equipment.

The present disclosure is directed to a modular data center including a base electrical module that is configured to be mounted on a wall. The base electrical module includes a compartment into which a power line enters and lands to a terminal block with a connection to a maintenance bypass switch. The base electrical module further includes a fan compartment and the ability to run network cables through an optional patch panel.

The modular data center further includes a removable first frame that is hinged to one end of the base electrical module, e.g., a left edge of the base electrical module, with a separate second frame for IT equipment that attaches to the hinged first rack frame. The modular data center further includes a door or cover is connected to the base electrical module, e.g., a right edge of the base electrical module, by hinges but that can also be removably attached with hardware such as bolts, clips, or other forms of fasteners.

The base electrical module of the modular data center of embodiments of the present disclosure address issues associated with prior base module concepts, including: 1) current wall mount IT racks are extremely difficult to install due to their size and weight since current wall mount IT racks typically embody one large metal box; and 2) current wall mount IT racks are very complicated to configure due to the collection of components often required in that they do not include integrated power terminals/connections, a maintenance bypass switch, filtered fan compartments, and removable racking frame.

Figure 17:
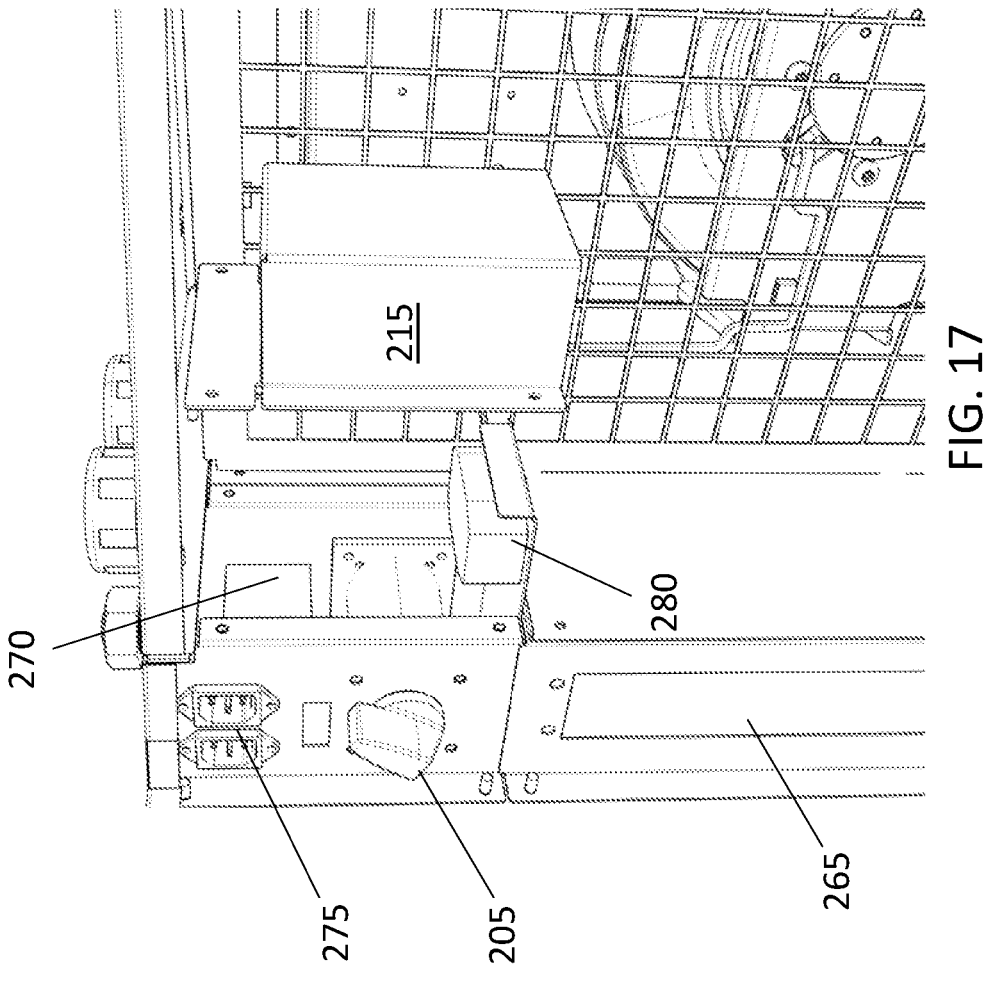
FIG. 17 is a close-up view of a portion of a base electrical module of an exemplary modular data center of embodiments of the present disclosure.

The modular data center 100 of embodiments of the present disclosure addresses these issues by separating and dividing the overall structure into three core modules with integrated technical components. Specifically, the modular data center 100 includes the base electrical module 200, which embodies a metal box having an integrated power connection terminal 270, input and output connectors 275, a maintenance bypass switch 205, and a fan module 220. The power connection terminal 270 is illustrated in the close-up view of a portion of the base electrical module in FIG. 17 in which a cover 215 that would normally cover the power connection terminal 270 is shown removed. In one embodiment, the base electrical module 200 is mounted on the wall by one or more cleats 225, which creates a small space, e.g., one-quarter to one-half inch, between a back of the base electrical module 200 and the wall.

The base electrical module 200 is configured to provide control and power to IT equipment mounted on an IT equipment rack 415, with the base electrical module 200 being external to the IT equipment rack 415. The base electrical module 200 can include a variety of components, including but not limited to a PDU, an additional PDU, one or more hardwire connections, an accommodation or feature for a subsequent module to be attached, one or more power distribution unit connections, a UPS, a management and security module, and a user interface coupled to the management and security module.

Figure 14:
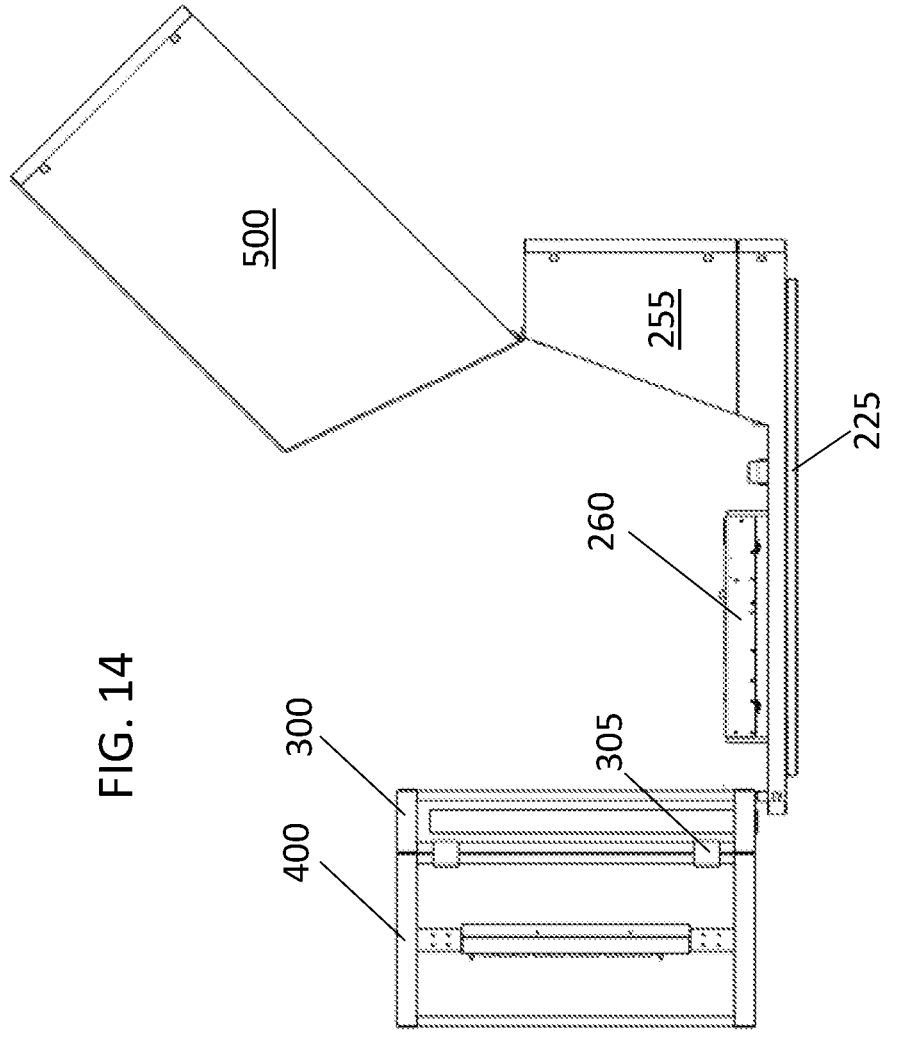
FIG. 14 is a view from the bottom of an exemplary modular data center of embodiments of the present disclosure in an open configuration.

The modular data center 100 further includes a removable IT frame structure 300, 400 and sealed cover 500. As shown and described below, there is a smaller first IT frame structure 300 secured to the base module 200 and a larger second IT frame structure 400 that is supported by the smaller first IT frame structure 300. The first IT frame structure 300 is configured to support a UPS 310 (shown in the exploded view of FIG. 14) to provide emergency power. The first IT frame structure 300 includes a UPS rack 315 including mounting features such as apertures or slots to which a UPS 310 may be attached. The UPS rack 315 may be formed integral with the first IT frame structure 300 or a separate element that is secures to the first IT frame structure with fasteners, for example, nuts, bolts, screws, or other fasteners known in the art.

The second IT frame structure 400 is configured to support IT equipment 410, for example, one or more servers (shown in the exploded view of FIG. 14) that receives power from the base electrical module 200. The second IT frame structure 400 includes an IT rack 415 including mounting features such as apertures or slots to which IT equipment 410 may be attached. The IT rack 415 may be formed integral with the second IT frame structure 400 or a separate element that is secures to the second IT frame structure with fasteners, for example, nuts, bolts, screws, or other fasteners known in the art. In one embodiment, the second IT frame structure 400 may include one or more power distribution units (PDUs) 405 to provide power connections to the IT equipment 410.

In one embodiment, the base electrical module 200 of the modular data center includes several conduit openings, e.g., three conduit openings 230, 235, 240, that are provided on, for example, a top right corner of the base electrical module 200, one (230) for power and two (235, 240) for network cables. Power connection runs into a small compartment in the base electrical module 200 in which the terminal block 270 and the bypass switch 205 are located, as well as two sockets 275 for input and output power to the UPS 310 and a power connection 280 for the fan module 220. (See FIG. 17.) The base electrical module 200 also accommodates hinges 245 on the left edge of the base electrical module 200 for the removable frame structures. A fan module 220 is provided on the right side of the base electrical module 200 and includes hinges 250 on the right edge of the base electrical module 200 to attach the cover 500. It is to be understood that in various embodiments each of hinges 245, 250 can embody any type of hinge, such as a barrel hinge, lift-off hinge, a corner hinge, a continuous or piano hinge, or a leaf hinge, to name a few.

In some embodiments, the base electrical module 200 further includes a temperature and/or humidity sensor 260 mounted to an internal wall thereof. In some embodiments, the temperature and/or humidity sensor 260 may also include additional features and functionality, for example, a security system, camera, internet gateway, etc. The temperature and/or humidity sensor 260 may be, for example, one of the NetBotz™ rack sensor/monitor modules available from Schneider Electric.

The first frame 300 is sized to fit a 1 U lithium-ion UPS 310 and has four cleats or clips 305 designed to hold a second frame structure 400, for example, a second frame structure sized for 6 U of rack space.

FIGS. 1-7 are a perspective view, a front elevational view, a rear elevational view, a right elevational view, a left elevational view, a view from the top, and a view from the bottom, respectively, of an exemplary modular data center 100 of embodiments of the present disclosure in a closed configuration. As shown, when fully assembled, the modular data center 100 achieves a compact design. As previously described, the modular data center includes the base electrical module 200 having a UPS bypass switch 205, a power connection terminal 270 coupled to the bypass switch 205, and a UPS power connector 275. (See FIG. 17.)

The modular data center 100 further includes a UPS 310 housed by the first IT frame structure 300 coupled to the base electrical module 200 and one or more items of IT equipment 410 housed by the second IT frame structure 400, which is coupled to the base electrical module 200 via the first IT frame structure 300. In one embodiment, the UPS 310 contains an alternating current ("AC") power back-up and battery, or reliable direct current ("DC") power for applications that require direct current.

In some embodiments, the UPS 310 can be connected, disconnected, or replaced by a person skilled in the art of managing IT equipment. This UPS 310 can be easily configured and integrated at a domestic or an international facility. The UPS 310 can be configured with components manufactured by various entities at partner module integration sites. When the UPS 310 is paired with a base electrical module 200 having a service bypass function, the UPS 310 can be serviced, upgraded, and/or swapped without service interruption of the IT equipment 410.

In some embodiments, the UPS 310 can be used to control power within the modular data center 100 and monitor certain aspects of the modular data center 100 including providing power readings and/or outlet switching. In one embodiment, the information can be communicated to an operator by an integrated network to a display, which can also function as a management controller.

FIGS. 8-14 are a perspective view, a front elevational view, a rear elevational view, a right elevational view, a left elevational view, a view from the top, and a view from the bottom, respectively, of the modular data center 100 with the cover 500 in an open position. As shown, the first IT frame structure 200 and the second IT frame structure 300 are configured achieve a nested position adjacent the base electrical module 200. The base electrical module 200 is further shown to have a fan module compartment 255 that houses a fan module 220 to cool electronic components within the IT frame structures 200, 300. The cover 500 includes an opening 505 having a fan guard to allow airflow through the modular data center 100 over the UPS 310 and the IT equipment 410 when the cover 500 is in the closed position. The cover 500 can include a seal around a peripheral edge to seal the cover 500 when in the closed position shown in FIGS. 1-7. As previously described, the first IT frame structure 300 is configured to support the UPS 310 to provide emergency power to the IT equipment 410 supported by the second IT frame structure 400. Further, the second IT frame structure 400 may include one or more PDUs 405 to provide power connections to the IT equipment 410.

FIGS. 8, 9, 13, and 14 illustrate the first IT frame structure 300, which is configured to house the UPS 310 that receives power from the UPS power connector 275 associated with the base electrical module 200, and the second IT frame structure 400, which is configured to house IT equipment 410 that receives power from the base electrical module 200. As shown, the base electrical module 200 is external to the IT equipment rack 415 supported by the second IT frame structure 400.

The IT equipment rack 415 can be configured to receive one or more pieces of IT equipment 410, e.g., servers. The IT equipment rack 415 can be configured to achieve variable U-space distances, e.g., 4-6 U. In one embodiment, the IT equipment rack 415 can be configured as a 19-inch rack having 21-inch rails. The IT equipment 410, when housed by the IT equipment rack 415, can be accessed from the front and back of the IT equipment rack 415 when the IT frame structure 400 is in its open position with respect to the base electrical module 200. The IT equipment 410 further can be accessed from the top and/or the bottom of the IT equipment rack 415.

Figure 8:
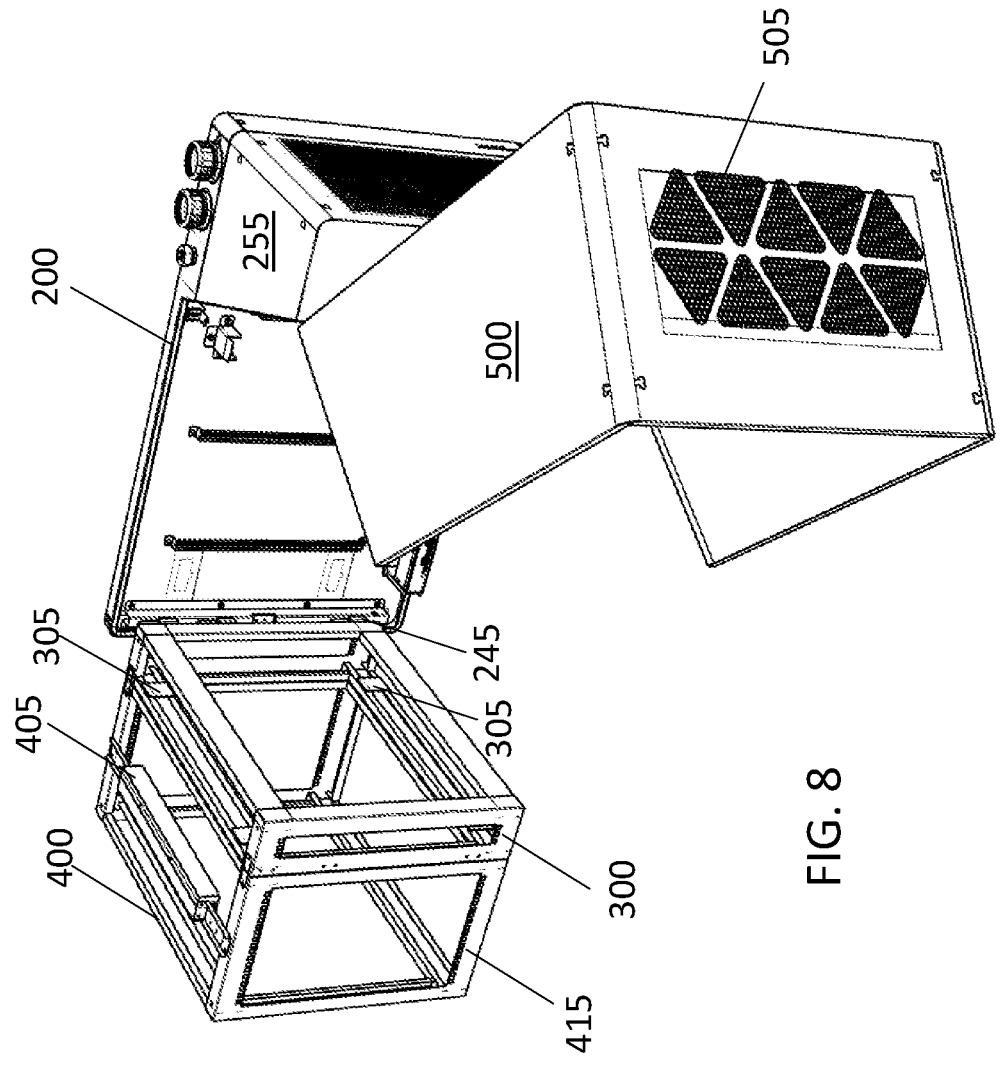
FIG. 8 is a perspective view of an exemplary modular data center of embodiments of the present disclosure in an open configuration.
Figure 9:
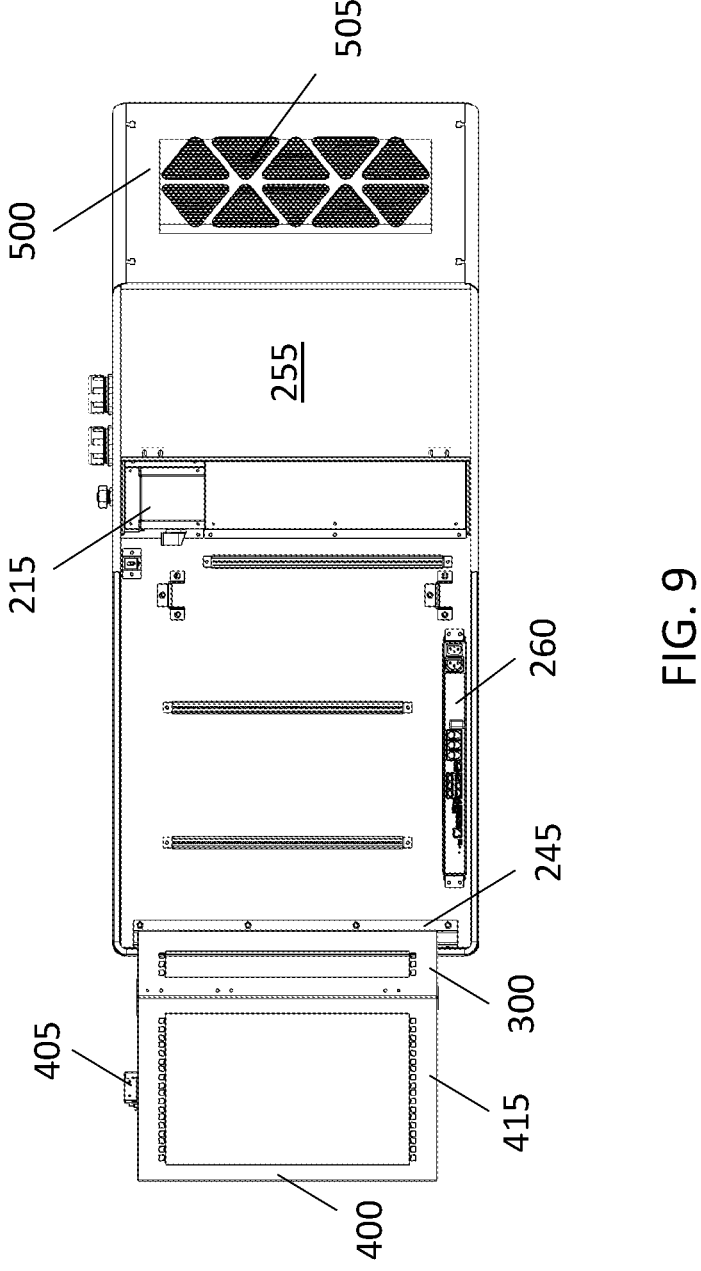
FIG. 9 is a front elevational view of an exemplary modular data center of embodiments of the present disclosure in an open configuration.
Figure 10:
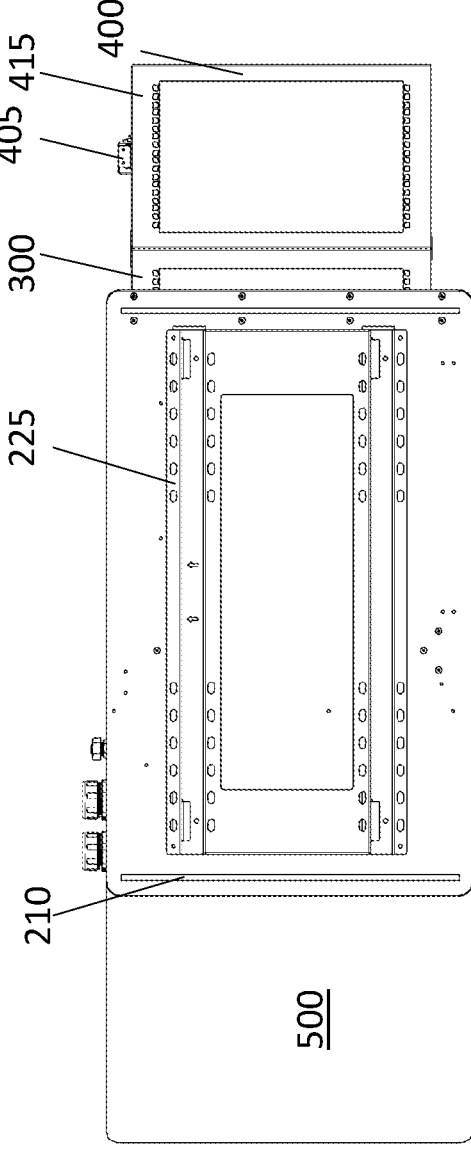
FIG. 10 is a rear elevational view of an exemplary modular data center of embodiments of the present disclosure in an open configuration.
Figure 11:
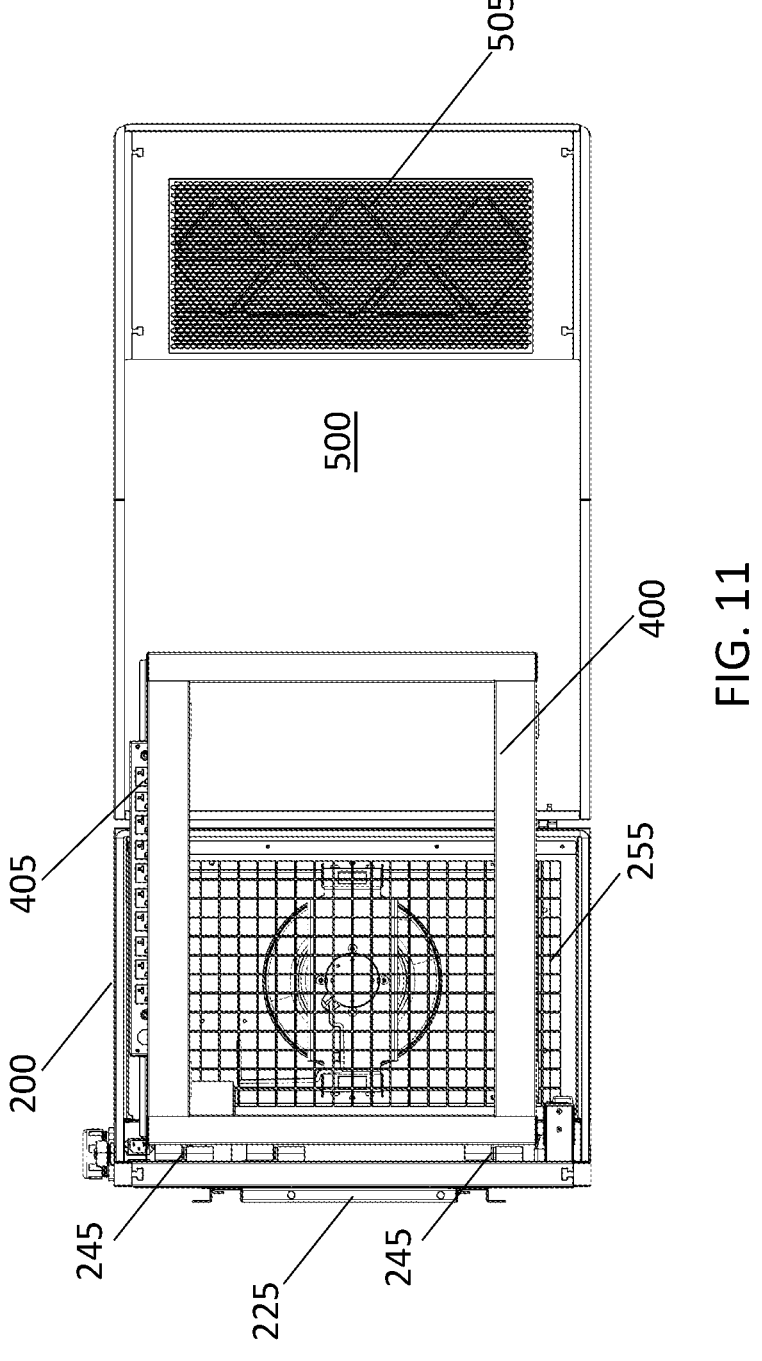
FIG. 11 is a right elevational view of an exemplary modular data center of embodiments of the present disclosure in an open configuration.
Figure 12:
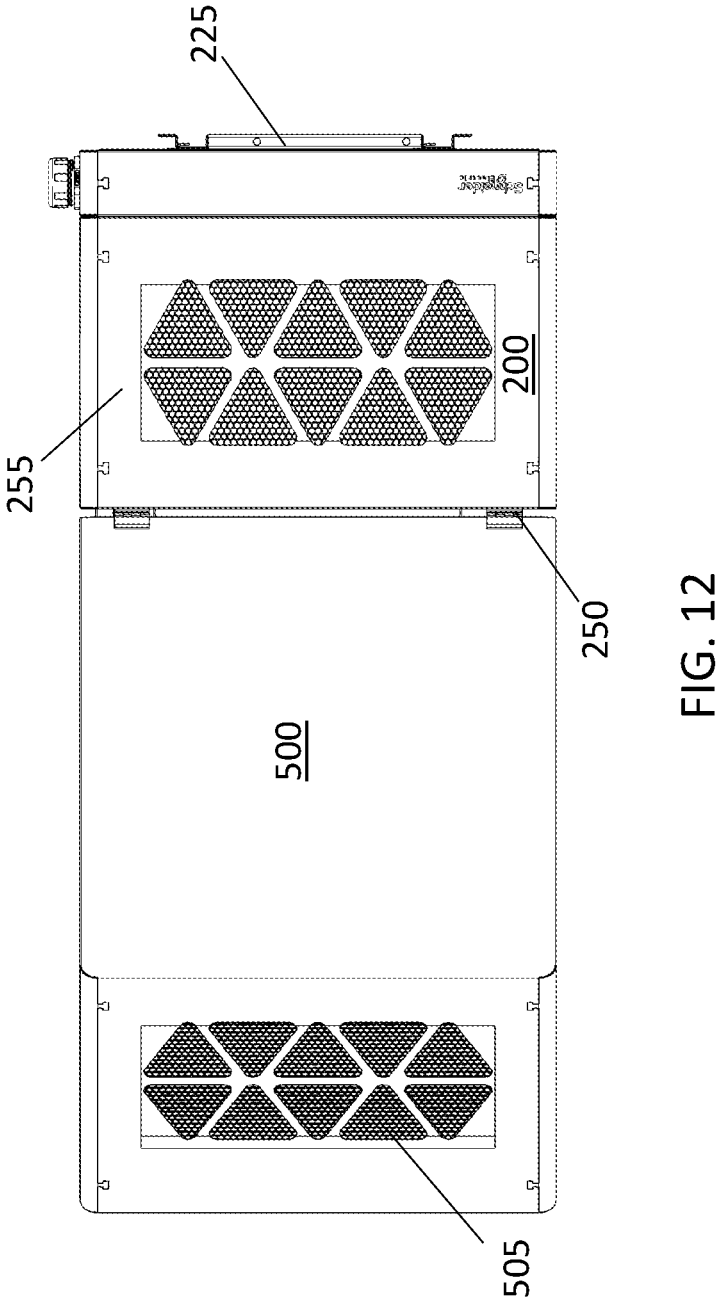
FIG. 12 is a left elevational view of an exemplary modular data center of embodiments of the present disclosure in an open configuration.
Figure 13:
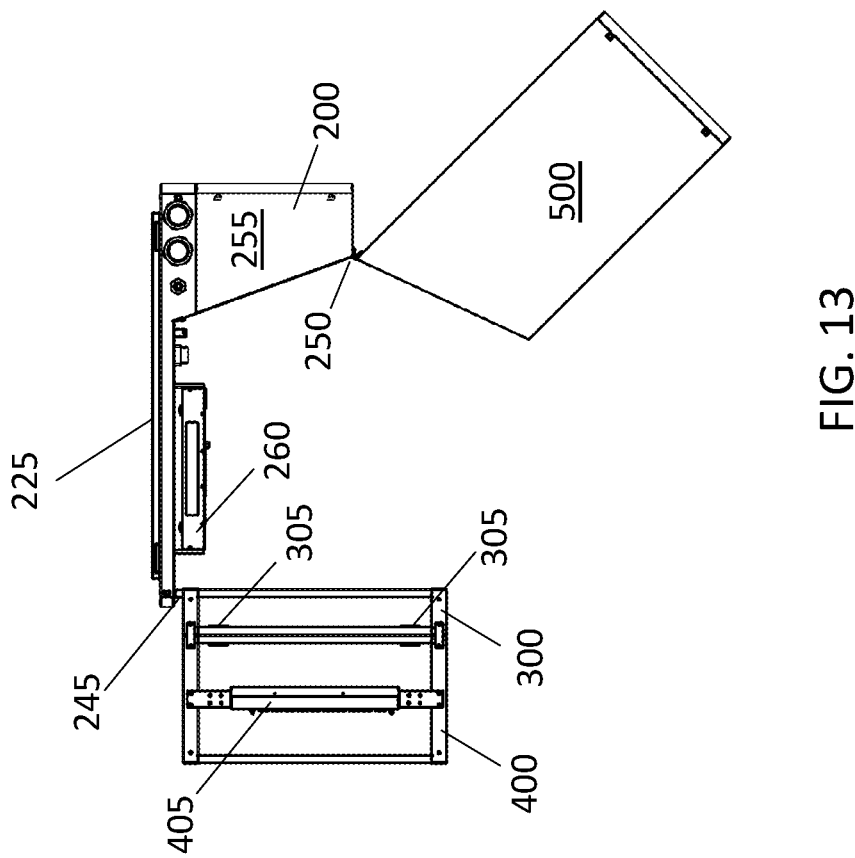
FIG. 13 is a view from the top of an exemplary modular data center of embodiments of the present disclosure in an open configuration.

FIGS. 8, 9, and 13 illustrate the first and second IT frame structures 300, 400 and the cover 500 in a fully open position. As shown, the base electrical module 200 includes the fan compartment 255 that receives the fan module 220. The fan module 220 is provided to cool the UPS 310 and the IT equipment 410 housed by the first and second IT frame structures 300, 400, respectively.

FIG. 9 illustrates the location of the bypass switch 205 within the base electrical module 200.

Figure 15:
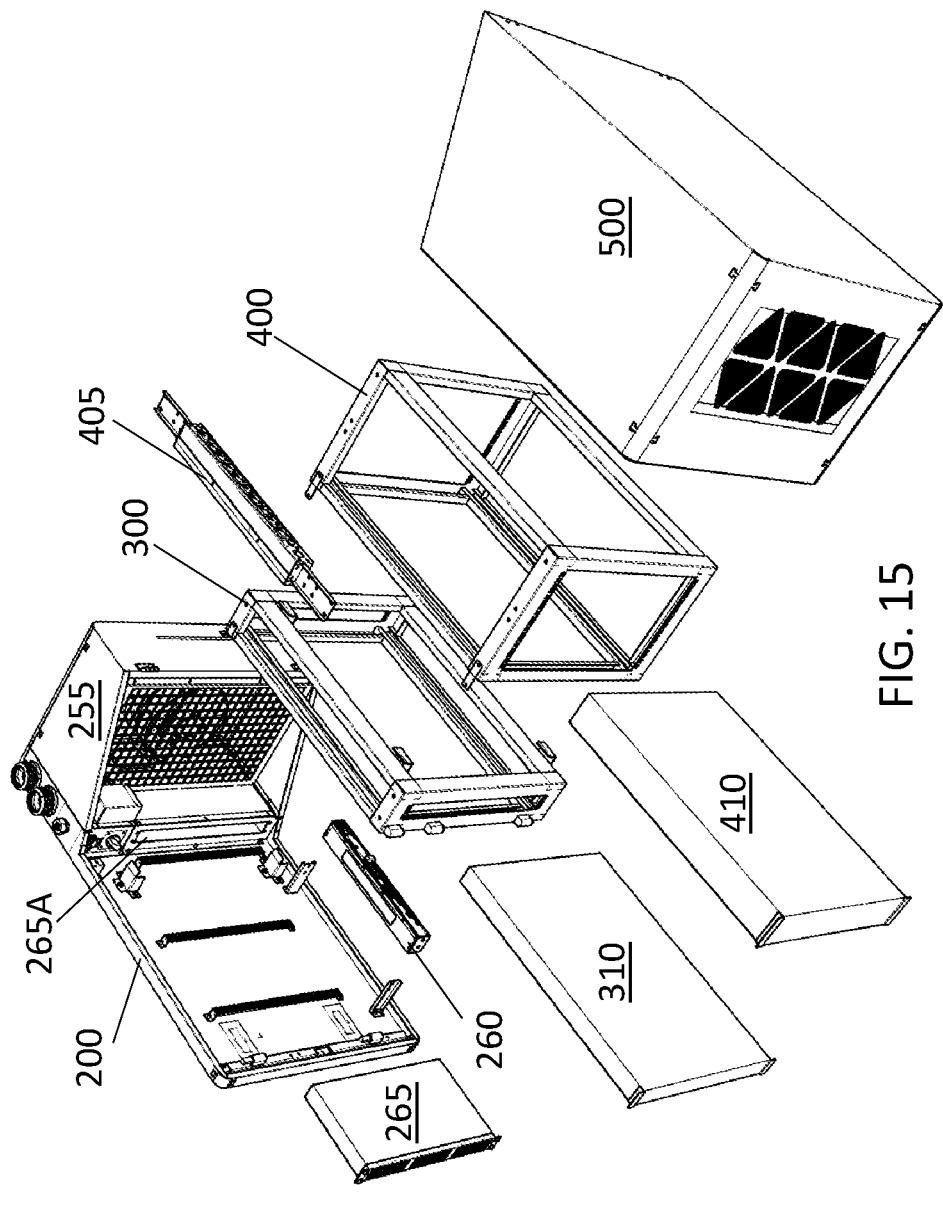
FIG. 15 is an exploded view of an exemplary modular data center of embodiments of the present disclosure.
Figure 16:
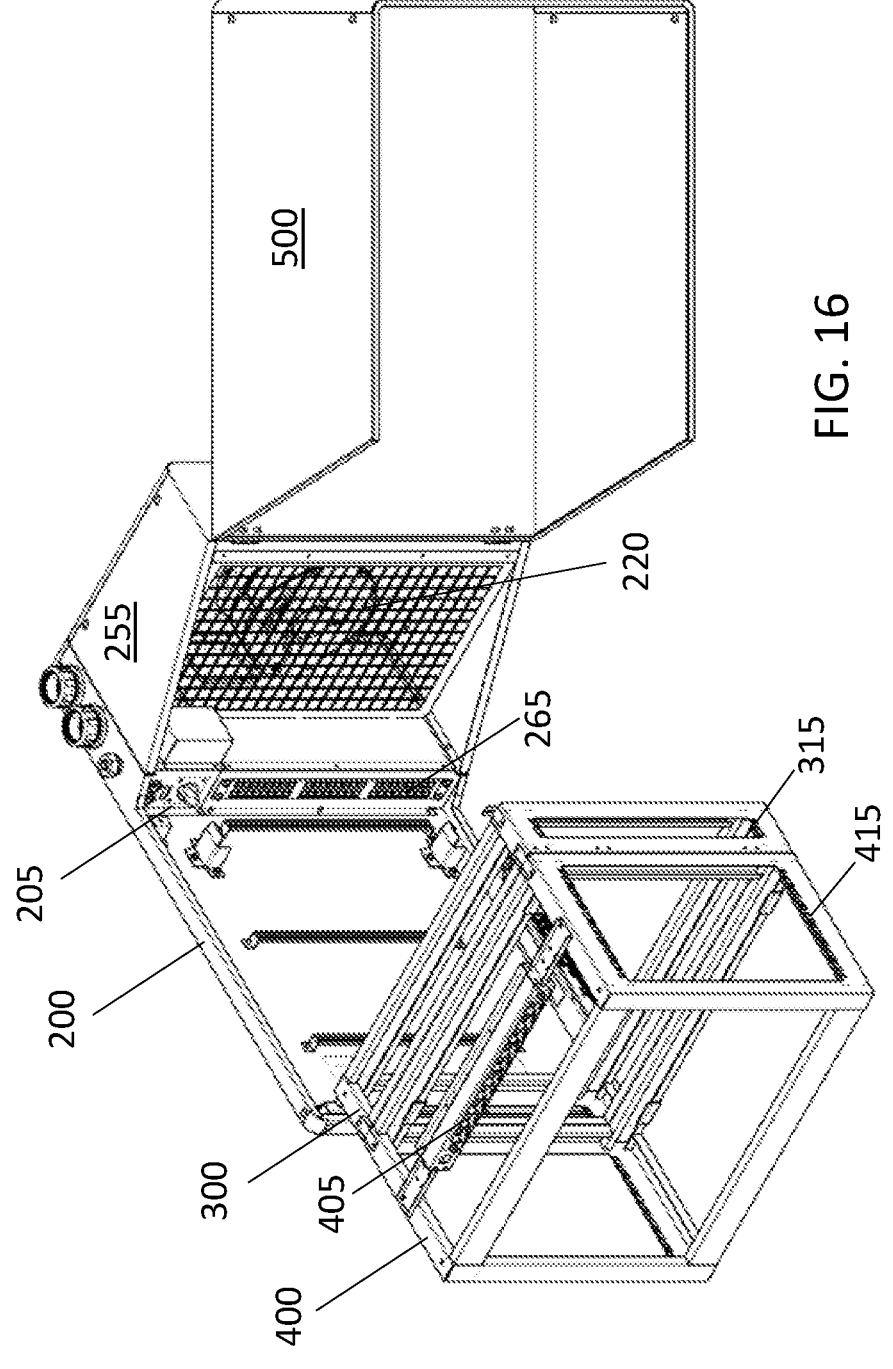
FIG. 16 is an isometric view of an exemplary modular data center of embodiments of the present disclosure in an open configuration.

In some embodiments, a patch panel 265 having CAT 5 cables (shown in exploded view of FIG. 14 with cables omitted for clarity) can be integrated into the base electrical module 200 of the modular data center 100. The patch panel 265 may be disposed within compartment 265A (shown in FIG. 15) when the modular data center 100 is assembled, as illustrated in FIG. 16.

In some embodiments, an Internet gateway device can be integrated into the base electrical module 200 of the modular data center 100, for example, as part of the temperature and/or humidity sensor 260 as discussed above, or as a separate module.

In some embodiments, the PDU 405 (or multiple PDUs 405) can be provided in the base electrical module 200 and/or the first IT frame structure 300.

In some embodiments, the base electrical module 200 can include a visual indication 210 (see, e.g., FIG. 3) of the status of the modular data center. For example, a set of LEDs (green, amber and red LEDs) may be provided on the rear of the base electrical module 200 to reflect off a wall on which the modular datacenter 100 is mounted to provide an operator an indication of a status of the modular data center, with green representing an operational status, amber representing a warning status, and red representing an alarm or alert status.

In some embodiments, the IT equipment and the modules described herein are components that can be configured to be hot-swappable.

Figure 18:
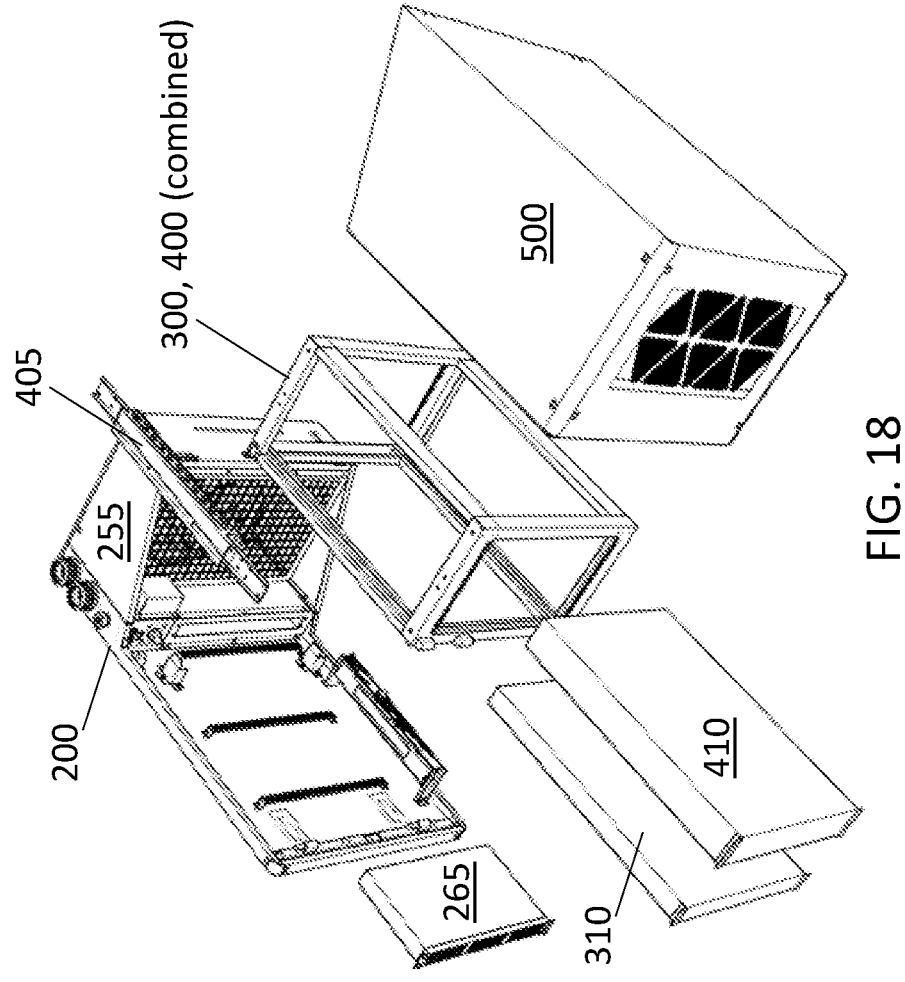
FIG. 18 is an exploded view of an exemplary modular data center of another embodiment of the present disclosure.

It should be understood that the modular data center 100 can be provided in a variety of shapes and sizes, and configured to support different power configurations. For example, in an alternate embodiment illustrated in FIG. 18 the first and second IT frame structures 300, 400 are combined into a single frame structure. In both FIGS. 15 and 18 the UPS 310 and IT equipment module 410 are shown removed from the positions they would occupy within their respective frames 300, 400 for clarity of illustration.

Various aspects and functions in accordance with the present embodiments may be implemented as specialized hardware or software executing in one or more computer systems, which may include a computer system that includes processor, memory, bus, interface, and storage. The processor may perform a series of instructions that result in manipulated data. The processor may be a commercially available processor, multi-processor, microprocessor, or controller as many other processors and controllers are available. The processor may be connected to other system elements, including one or more memory devices, by bus.

Memory may be used for storing programs and data during operation of computer system. Thus, memory may be a relatively high performance, volatile, random access memory such as a dynamic random access memory (DRAM) or static memory (SRAM). However, memory may include any device for storing data, such as a disk drive or other nonvolatile, non-transitory, storage device. Various embodiments in accordance with the present disclosure may organize memory into particularized and, in some cases, unique structures to perform the aspects and functions disclosed herein.

Components of the computer system may be coupled by an interconnection element, such as a bus, which may include one or more physical busses, for example, busses between components that are integrated within a same machine, but may include any communication coupling between system elements including specialized or standard computing bus technologies such as IDE, SCSI, PCI, and InfiniBand. Thus, the bus enables communications, for example, data and instructions, to be exchanged between system components of computer system.

The computer system also may include one or more interface devices, such as input devices, output devices, and combination input/output devices. Interface devices may receive input or provide output. More particularly, output devices may render information for external presentation. The interface devices may include, for example, one or more graphical user interfaces that may be disposed proximate to or separate from other components of the computer system. A graphical user interface of the computer system may, for example, be displayed through a web browser that accesses information from the memory. Input devices may accept information from external sources. Examples of interface devices include keyboards, mouse devices, trackballs, microphones, touch screens, printing devices, display screens, speakers, network interface cards, etc. The interface devices allow computer system to exchange information and communicate with external entities, such as users and other systems.

The storage system may include a computer readable and writeable, nonvolatile, non-transitory, storage medium in which instructions are stored that define a program to be executed by the processor. The program to be executed by the processor may cause the processor or computer system to perform any one or more embodiments of the methods disclosed herein. The storage system also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk, or flash memory, among others. In operation, the processor or some other controller may cause data to be read from the nonvolatile recording medium into another memory, such as memory, that allows for faster access to the information by the processor than does the storage medium included in storage system. The memory may be located in storage system or in memory, however, processor may manipulate the data within the memory, and then may copy the data to the medium associated with storage system after processing is completed. A variety of components may manage data movement between the medium and integrated circuit memory element and the presently described embodiments are not limited thereto. Further, the embodiments are not limited to a particular memory system or data storage system. Portions of the memory or storage system may be included in the same computer system as other components of the computer system or may be resident in a cloud-based system that is accessible via the internet or other communications system or protocol.

Although the computer system is described by way of example as one type of computer system upon which various aspects and functions in accordance with the present embodiments may be practiced, any aspects of the presently disclosed embodiments are not limited to being implemented on the computer system. Various aspects and functions in accord with the presently disclosed embodiments may be practiced on one or more computers having a different architectures or components. For instance, computer system may include specially-programmed, special-purpose hardware, such as for example, an application-specific integrated circuit (ASIC) tailored to perform a particular operation disclosed herein. While another embodiment may perform the same function using several general-purpose computing devices running MAC OS System X with Motorola PowerPC processors and several specialized computing devices running proprietary hardware and operating systems.

The computer system may be a computer system including an operating system that manages at least a portion of the hardware elements included in computer system. Usually, a processor or controller, such as processor, executes a commercially available operating system. Many types of operating systems may be used, and embodiments are not limited to any particular implementation.

The processor and operating system together define a computer platform for which application programs in high-level programming languages may be written. These component applications may be executable, intermediate, for example, C-, bytecode or interpreted code which communicates over a communication network, for example, the Internet, using a communication protocol, for example, TCP/IP. Similarly, aspects in accord with the presently disclosed embodiments may be implemented using an object-oriented programming language, such as .Net, Small-Talk, Java, C++, Ada, or C# (C-Sharp). Other object-oriented programming languages may also be used. Alternatively, functional, scripting, or logical programming languages may be used.

Additionally, various aspects and functions in accordance with the presently disclosed embodiments may be implemented in a non-programmed environment, for example, documents created in HTML, XML, or other format that, when viewed in a window of a browser program, render aspects of a graphical-user interface or perform other functions. Further, various embodiments in accord with the present disclosure may be implemented as programmed or non-programmed elements, or any combination thereof. For example, a web page may be implemented using HTML while a data object called from within the web page may be written in C++. Thus, the presently disclosed embodiments are not limited to a specific programming language and any suitable programming language could also be used.

A computer system included within an embodiment may perform additional functions outside the scope of the presently disclosed embodiments. For instance, aspects of the system may be implemented using an existing commercial product, such as, for example, Database Management Systems such as SQL Server available from Microsoft of Seattle WA., Oracle Database from Oracle of Redwood Shores, CA, and MySQL from MySQL AB, a subsidiary of Oracle or integration software such as Web Sphere middleware from IBM of Armonk, NY. However, a computer system running, for example, SQL Server may be able to support both aspects in accord with the presently disclosed embodiments and databases for sundry applications.

It is to be appreciated that examples of the methods, systems, and apparatuses discussed herein are not limited in application to the details of construction and the arrangement of components set forth in the following description or illustrated in the accompanying drawings. The methods, systems, and apparatuses are capable of implementation in other examples and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A modular data center comprising:
   a base electrical module including an uninterruptible power supply (UPS) bypass switch and a UPS power connector;

a first frame coupled to the base electrical module and configured to house a UPS that receives power from the UPS power connector;

a second frame coupled to the base electrical module and configured to house information technology (IT) equipment that receives power from the base electrical module, the base electrical module being external to the second frame; and a cover coupled to the base electrical module with a hinge that allows the cover to move inwards towards the base electrical module and outwards away from the base electrical module, the cover covering multiple sides of the first frame and multiple sides of the second frame when in a closed position.

2. The modular data center of claim 1, wherein the base electrical module further includes a power connection terminal coupled to the bypass switch.

3. The modular data center of claim 1, further comprising a UPS rack included in the first frame, the UPS rack configured for mounting the UPS thereto.

4. The modular data center of claim 1, further comprising a UPS rack coupled to the first frame.

5. The modular data center of claim 1, further comprising an IT equipment rack included in the second frame, the IT equipment rack configured for mounting the IT equipment thereto.

6. The modular data center of claim 1, further comprising an IT equipment rack coupled to the second frame.

7. The modular data center of claim 1, wherein the base electrical module further includes a fan module configured to direct air through an IT equipment rack.

8. The modular data center of claim 1, further comprising:

a fan module included in the base electrical module and configured to direct air through the second frame.

9. The modular data center of claim 1, wherein the base electrical module is configured to be mounted to a wall.

10. The modular data center of claim 1, wherein the second frame is indirectly coupled to the base electrical module.

11. The modular data center of claim 1, further comprising a UPS rack included in the first frame and an IT equipment rack included in the second frame.

12. The modular data center of claim 1, wherein the second frame is removably supported by the first frame.

13. The modular data center of claim 1, wherein the second frame is removably clipped to the first frame.

14. The modular data center of claim 1, wherein the cover is removably coupleable to the base electrical module.

15. The modular data center of claim 1, further comprising a power distribution unit having a plurality of outlets mounted on the second frame and configured to provide power from the base electrical module to the IT equipment.

16. The modular data center of claim 1, wherein the base electrical module further includes a patch panel.

17. The modular data center of claim 1, wherein the base electrical module further includes an Internet gateway device.

18. The modular data center of claim 1, further comprising a power distribution unit having a plurality of outlets mounted on the first frame.

19. The modular data center of claim 1, wherein the base electrical module further includes a visual indicator of status of the modular data center.

20. The modular data center of claim 1, further comprising at least one backup UPS.

21. The modular data center of claim 1, further comprising at least one server.

22. A method of assembling and installing a modular data center, the method comprising:

installing a base electrical module on a wall, the base electrical module including an uninterruptible power supply (UPS) bypass switch and a UPS power connector;

connecting a first frame to the base electrical module, the first frame configured to house a UPS that receives power from the UPS power connector;

connecting a second frame to the first frame, the second frame configured to house information technology (IT) equipment that receives power from the base electrical module, the base electrical module being external to the second frame; and connecting, using a hinge, a cover coupled to the base electrical module, the hinge allowing the cover to move inwards towards the base electrical module and outwards away from the base electrical module, the cover covering multiple sides of the first frame and multiple sides of the second frame when in a closed position.

23. The method of claim 22, further comprising securing a power distribution unit to the second frame.

24. The method of claim 22, further comprising securing a backup UPS module to the first frame.

25. The modular data center of claim 1, wherein the first frame is coupled to the base electrical module with an additional hinge allowing the first frame to move inwards towards the base electrical module and outwards away from the base electrical module.

26. The method of claim 22, wherein the base electrical module further includes a visual indicator configured to cause a status of the modular data center to be reflected off the wall.

27. The modular data center of claim 1, wherein the base electrical module is configured to be mounted to a wall along a rear of the base electrical module, and wherein the base electrical module further includes a visual indicator configured to cause a status of the modular data center to be reflected off the wall.

* * * * *